(12) United States Patent
Song et al.

(10) Patent No.: US 11,600,952 B2
(45) Date of Patent: *Mar. 7, 2023

(54) BACKPLANE CONNECTOR WITH IMPROVED STRUCTURE

(71) Applicant: DONGGUAN LUXSHARE TECHNOLOGIES CO., LTD, Dongguan (CN)

(72) Inventors: Tao Song, Dongguan (CN); Kun Liu, Dongguan (CN); Rongzhe Guo, Dongguan (CN); Chuanqi Gong, Dongguan (CN); Xiaogang Liu, Dongguan (CN); Ming Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 159 days.

This patent is subject to a terminal disclaimer.

(21) Appl. No.: 17/333,958

(22) Filed: May 28, 2021

(65) Prior Publication Data

US 2021/0399471 A1    Dec. 23, 2021

(30) Foreign Application Priority Data

Jun. 19, 2020 (CN) .......................... 202010567796.4
Sep. 7, 2020 (CN) .......................... 202021934671.2

(51) Int. Cl.
*H01R 4/66* (2006.01)
*H01R 13/6471* (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/716; H01R 12/724; H01R 12/71; H01R 13/6471;
(Continued)

(56) References Cited

U.S. PATENT DOCUMENTS 4,601,527 A   7/1986  Lemke
5,664,968 A   9/1997  Mickievicz
(Continued)

FOREIGN PATENT DOCUMENTS

CN    1244959 A    2/2000
CN    2513252 Y    9/2002
(Continued)

*Primary Examiner* — Khiem M Nguyen
(74) *Attorney, Agent, or Firm* — Birch, Stewart, Kolasch & Birch, LLP

(57) ABSTRACT

A backplane connector includes a number of wafers and a spacer for assembling the wafers together. Each wafer includes an insulating frame and a number of conductive terminals fixed to the insulating frame. The insulating bracket includes a first protrusion and a second protrusion. The spacer includes a first body portion and a second body portion. The first body portion includes a first clamping slot for clamping the first protrusion. The second body portion includes a second clamping slot for clamping the second protrusion. The present disclosure increases the ability of the spacer to resist external forces and improves the structural stability of the backplane connector.

10 Claims, 21 Drawing Sheets

(51) Int. Cl.

| | |
|---|---|
| *H01R 13/40* | (2006.01) |
| *H01R 13/6587* | (2011.01) |
| *H01R 13/6591* | (2011.01) |
| *H01R 13/514* | (2006.01) |
| *H01R 13/518* | (2006.01) |
| *H01R 12/72* | (2011.01) |
| *H01R 13/6586* | (2011.01) |
| *H01R 12/58* | (2011.01) |
| *H05K 1/11* | (2006.01) |
| *H01R 13/6588* | (2011.01) |
| *H01R 13/6583* | (2011.01) |
| *H01R 13/6585* | (2011.01) |
| *H01R 13/6582* | (2011.01) |
| *H01R 43/24* | (2006.01) |
| *H01R 12/71* | (2011.01) |
| *H01R 13/20* | (2006.01) |
| *H01R 13/504* | (2006.01) |
| *H01R 13/6461* | (2011.01) |
| *H01R 13/6584* | (2011.01) |
| *H01R 13/6474* | (2011.01) |

(52) U.S. Cl.
CPC ............ *H01R 12/724* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H01R 12/71* (2013.01); *H01R 13/6474* (2013.01)

(58) Field of Classification Search
CPC ............ H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 43/24; H05K 1/115
USPC .................................................. 439/108, 701
See application file for complete search history.

(56) References Cited

U.S. PATENT DOCUMENTS

| | | | |
|---|---|---|---|
| 9,350,126 B2 | 5/2016 | Little et al. | |
| 11,495,918 B2 * | 11/2022 | Song | H01R 13/514 |
| 2004/0043658 A1 | 3/2004 | Ko | |
| 2004/0229510 A1 | 11/2004 | Lloyd et al. | |
| 2007/0155239 A1 | 7/2007 | Nakada | |
| 2008/0014798 A1 | 1/2008 | Pan | |
| 2013/0203273 A1 | 8/2013 | Rathburn | |
| 2014/0051295 A1 | 2/2014 | Westman et al. | |
| 2014/0248796 A1 | 9/2014 | Pan | |
| 2014/0295705 A1 | 10/2014 | Lee et al. | |
| 2015/0194771 A1 | 7/2015 | Pan | |
| 2015/0303618 A1 | 10/2015 | Lee et al. | |
| 2015/0318642 A1 | 11/2015 | Lee et al. | |
| 2016/0093985 A1 | 3/2016 | Zhang et al. | |
| 2016/0322760 A1 | 11/2016 | Long et al. | |
| 2018/0166828 A1 | 6/2018 | Gailus | |
| 2019/0044284 A1 | 2/2019 | Dunham | |

FOREIGN PATENT DOCUMENTS

| | | |
|---|---|---|
| CN | 2571026 Y | 9/2003 |
| CN | 1491465 A | 4/2004 |
| CN | 1592999 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203288874 U | 11/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105612664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |
| CN | 208955335 U | 6/2019 |
| CN | 109994892 A | 7/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |

(56) References Cited

FOREIGN PATENT DOCUMENTS

| | | |
|---|---|---|
| TW | I528659 B | 4/2016 |
| TW | I545845 B | 8/2016 |
| TW | 201733225 A | 9/2017 |
| TW | I600231 B | 9/2017 |
| TW | 201810825 A | 3/2018 |
| TW | I623154 B | 5/2018 |
| TW | 201834333 A | 9/2018 |
| TW | 201841440 A | 11/2018 |
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| WO | WO 2016/168820 A1 | 10/2016 |
| WO | WO 2017/106266 A1 | 6/2017 |

* cited by examiner

BACKPLANE CONNECTOR WITH IMPROVED STRUCTURE

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202021934671.2, filed on Sep. 7, 2020 and titled "BACKPLANE CONNECTOR", the entire content of which is incorporated herein by reference.

TECHNICAL FIELD

The present disclosure relates to a backplane connector which belongs to a technical field of connectors.

BACKGROUND

The existing backplane connectors usually include an insulating housing, a plurality of wafers assembled to the insulating housing, and a spacer for combining the wafers together. Each wafer includes an insulating frame, a plurality of conductive terminals insert-molded with the insulating frame, and a metal shield disposed on at least one side of the insulating frame. The insulating frame includes a protrusion at a rear end, and the spacer includes a positioning groove for receiving the protrusion.

However, the existing spacer is usually of a flat plate configuration which only fixes and positions the wafers at the rear end thereof. When the spacer is subjected to external force, it is easy to loosen or fall off. Therefore, there is still room for improvement in the structural stability of the spacer.

SUMMARY

An object of the present disclosure is to provide a backplane connector having a spacer with improved structure.

In order to achieve the above object, the present disclosure adopts the following technical solution: a backplane connector, comprising a plurality of wafers and a spacer to combine the plurality of wafers; wherein each wafer comprises an insulating frame and a plurality of conductive terminals fixed to the insulating frame, the insulating frame comprises a first protrusion at a rear end of the insulating frame and a second protrusion at a top side of the insulating frame; and wherein the spacer comprises a first body portion and a second body portion, the first body portion comprises a first slot for locking with the first protrusion, and the second body portion comprises a second slot for locking with the second protrusion.

Compared with the prior art, the insulating frame of the present disclosure includes a first protrusion at the rear and a second protrusion at the top. The spacer includes a first slot for holding the first protrusion and a second slot for holding the second protrusion, thereby increasing the ability of the spacer to resist external forces and improving the structural stability thereof.

DETAILED DESCRIPTION

Figure 1:
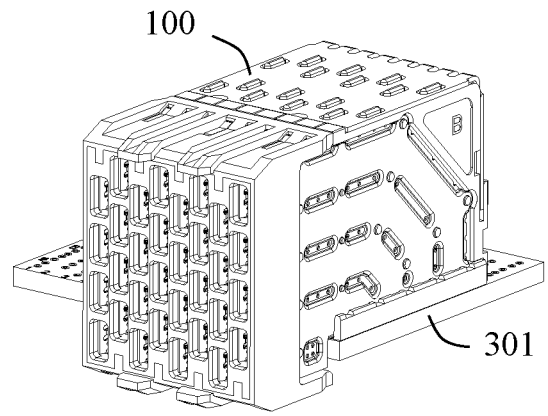
FIG. 1 is a perspective schematic view of a backplane connector in an accordance with an embodiment of the present disclosure, when it is mounted to a circuit board.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
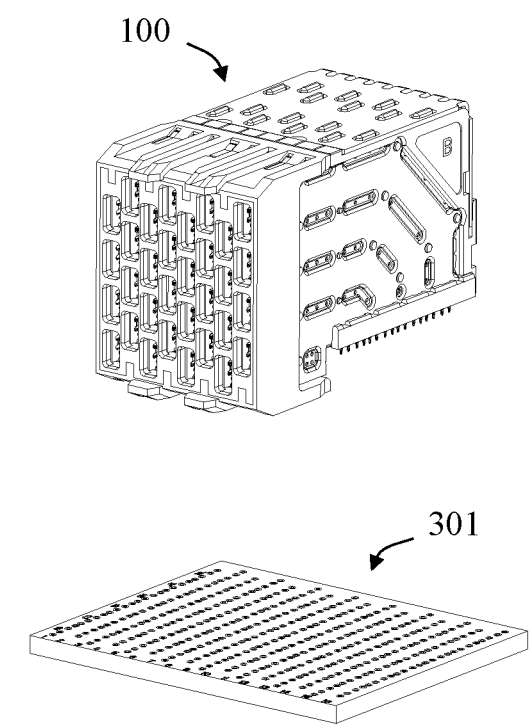
FIG. 2 is a partial perspective exploded view of FIG. 1.

Referring to FIGS. 1 and 2, an embodiment of the present disclosure discloses a backplane connector 100 which is adapted to be mounted on a circuit board 301 and to mate with a mating connector (not shown) so as to achieve high-speed signal transmission.

Figure 3:
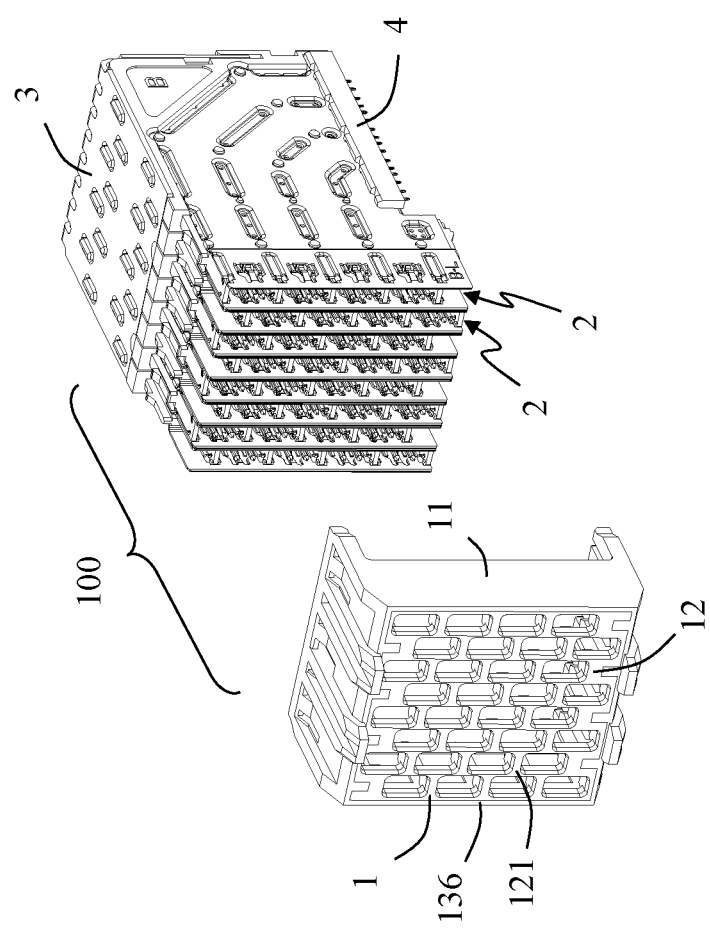
FIG. 3 is a partial perspective exploded view of the backplane connector in FIG. 2, in which a header is separated.
Figure 4:
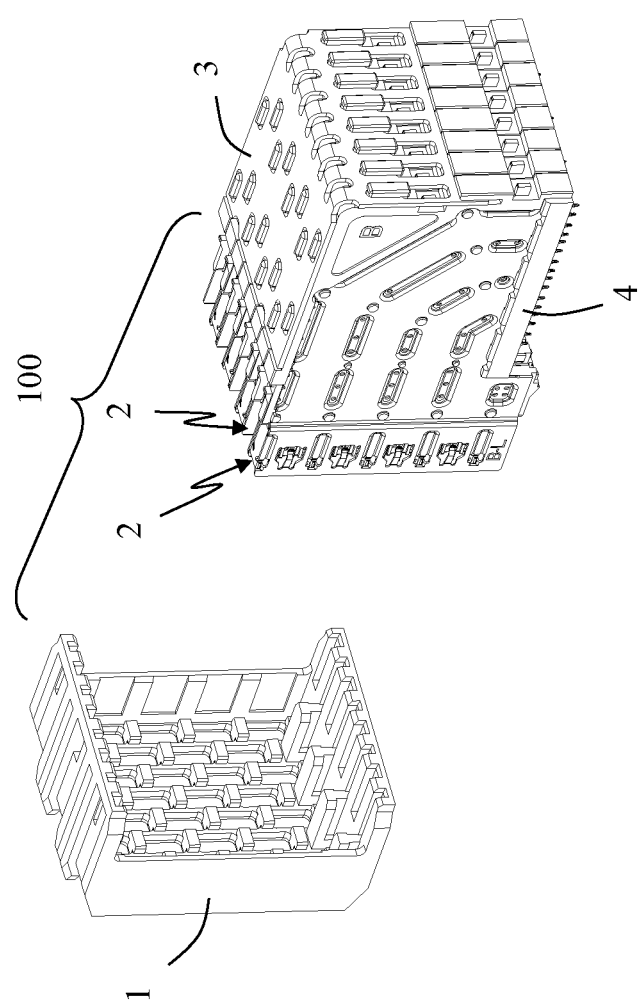
FIG. 4 is a partially exploded perspective view of FIG. 3 from another angle.

Referring to FIGS. 3 and 4, the backplane connector 100 includes a header 1, a plurality of wafers 2 assembled to the header 1, a spacer 3 fixed to the plurality of wafers 2, and a mounting block 4 fixed at a bottom end of the plurality of wafers 2. The wafers 2 are disposed side by side along a left-right direction.

Figure 5:
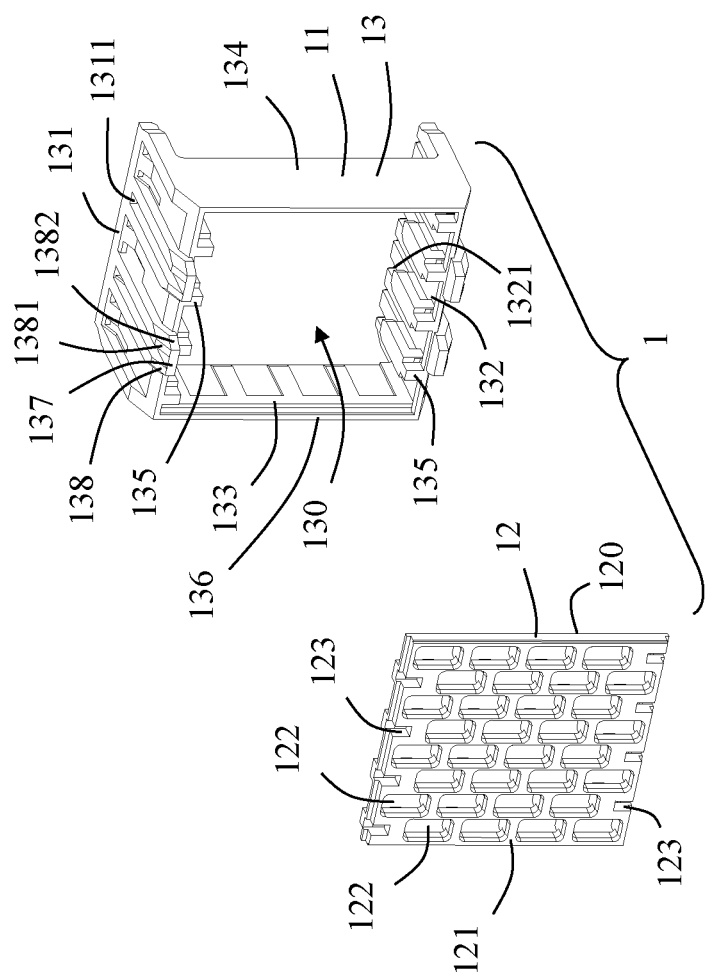
FIG. 5 is a perspective exploded view of the header.
Figure 6:
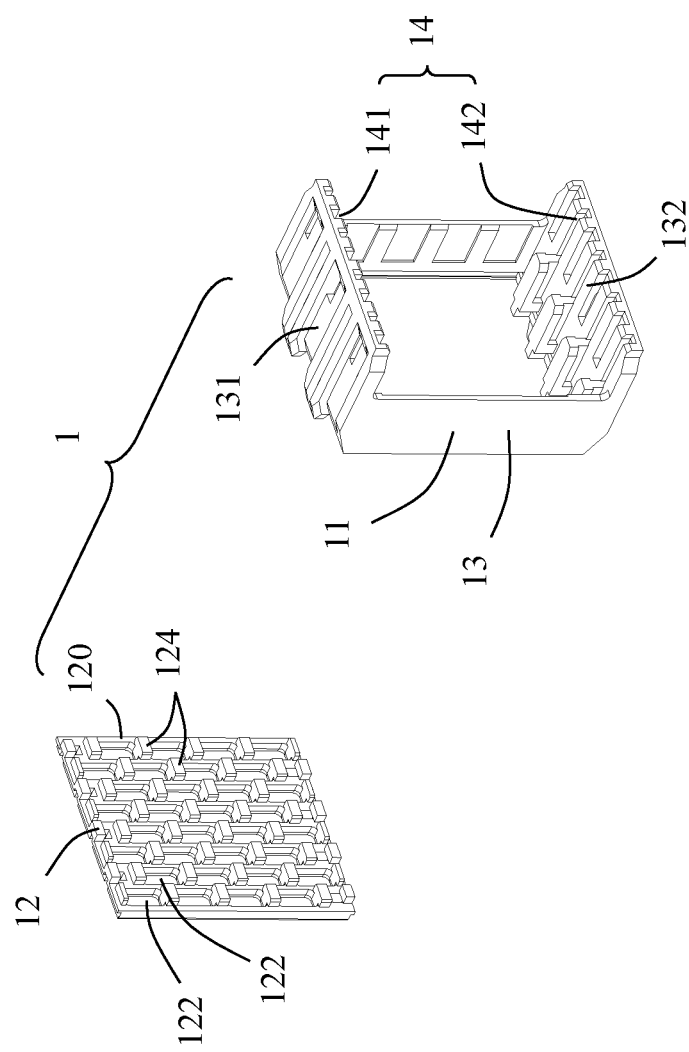
FIG. 6 is a perspective exploded view of FIG. 5 from another angle.

Referring to FIGS. 5 and 6, the header 1 includes an insulating housing 11 and a metal shell 12 fixed to the insulating housing 11. In the illustrated embodiment of the present disclosure, the metal shell 12 is insert-molded with the insulating housing 11 so as to form a whole. Of course, in other embodiments, the metal shell 12 may also be fixed to the insulating housing 11 by assembling.

Referring to FIGS. 5 and 6, the insulating housing 11 includes a frame portion 13 at a front end and a plurality of slots 14 located at a rear end for positioning the wafers 2. The frame portion 13 includes a first wall portion 131, a second wall portion 132 opposite to the first wall portion 131, a third wall portion 133 connecting one side of the first wall portion 131 and the second wall portion 132, and a fourth wall portion 134 connecting the other side of the first wall portion 131 and the second wall portion 132. The first wall portion 131, the second wall portion 132, the third wall portion 133 and the fourth wall portion 144 are enclosed so as to form an opening 130 for receiving the metal shell 12. A bottom surface of the first wall portion 131 and/or a top surface of the second wall portion 132 include a plurality of protrusion blocks 135 protruding into the opening 130. The first wall portion 131 has a plurality of first locking grooves 1311 extending upwardly through the first wall portion 131. The second wall portion 132 has a plurality of second locking grooves 1321 extending downwardly through the second wall portion 132. The first locking grooves 1311 and the second locking grooves 1321 are adapted to lock the wafers 2 so as to prevent the wafers 2 from being separated from the header 1. The frame portion 13 includes a front surface 136. The first wall portion 131 and/or the second wall portion 132 include a plurality of positioning protrusions 137 protruding forwardly beyond the front surface 136. Each positioning protrusion 137 includes a guiding inclined surface 138 at a front end thereof. The guiding inclined surface 138 is adapted to guide insertion of the backplane connector 100 into the mating connector. Referring to FIG. 5, in the illustrated embodiment of the present disclosure, the guiding inclined surface 138 includes a plurality of first guiding inclined surfaces 1381 located on a top surface and a plurality of second guiding inclined surfaces 1382 located on two side surfaces.

The slot 14 includes a plurality of first slots 141 disposed on the bottom surface of the first wall portion 131 and communicating with the first locking grooves 1311, and a plurality of second slots 142 disposed on the top surface of the second wall portion 132 and communicating with the second locking grooves 1321. The first slot 141 and the second slot 142 in alignment with each other in a top-bottom direction are adapted for jointly positioning the same wafer 2.

Figure 7:
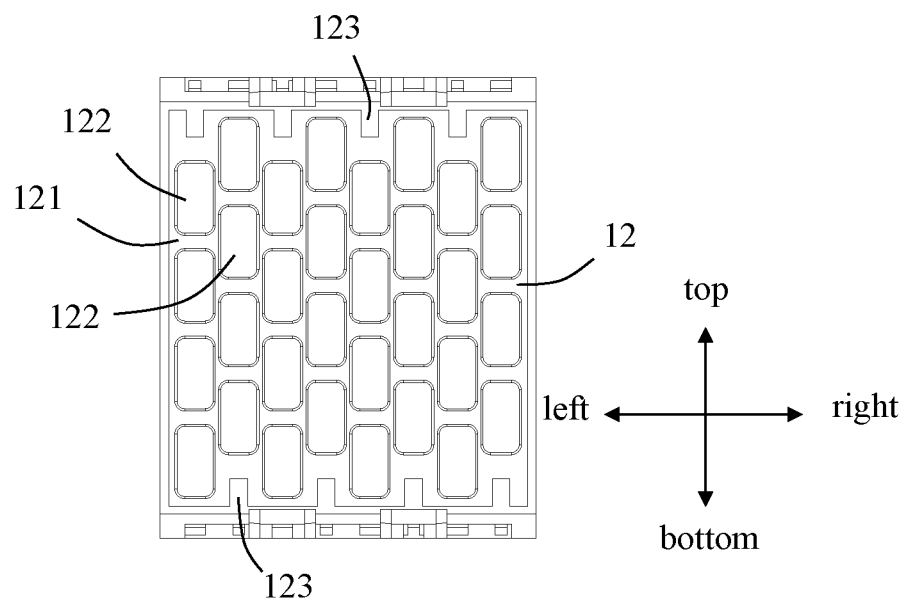
FIG. 7 is a front view of a metal shell.
Figure 8:
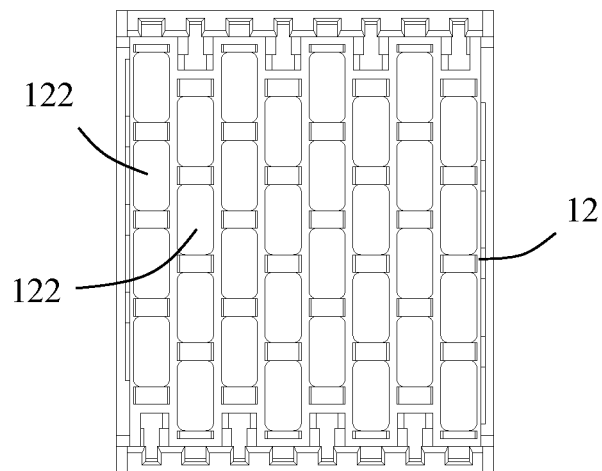
FIG. 8 is a rear view of the metal shell.

Referring to FIGS. 5 to 8, the metal shell 12 includes a mating surface 121, an inner surface 120 opposite to the mating surface 121, a plurality of terminal receiving grooves 122 extending through the mating surface 121 and the inner surface 120, and a plurality of contact protrusions 124 extending from the inner surface 120 in a direction away from the mating surface 121. A top wall and a bottom wall of the metal shell 12 respectively include receiving grooves 123 for accommodating the protrusion blocks 135. Referring to FIG. 7, in the illustrated embodiment of the present disclosure, the terminal receiving grooves 122 are disposed in multiple rows along the left-right direction. Two adjacent rows of terminal receiving grooves 122 are staggered in the top-bottom direction. That is, the terminal receiving grooves 122 at corresponding positions in the two adjacent rows are not aligned in the left-right direction. This arrangement is beneficial to reduce signal crosstalk in two adjacent wafers 2.

Figure 9:
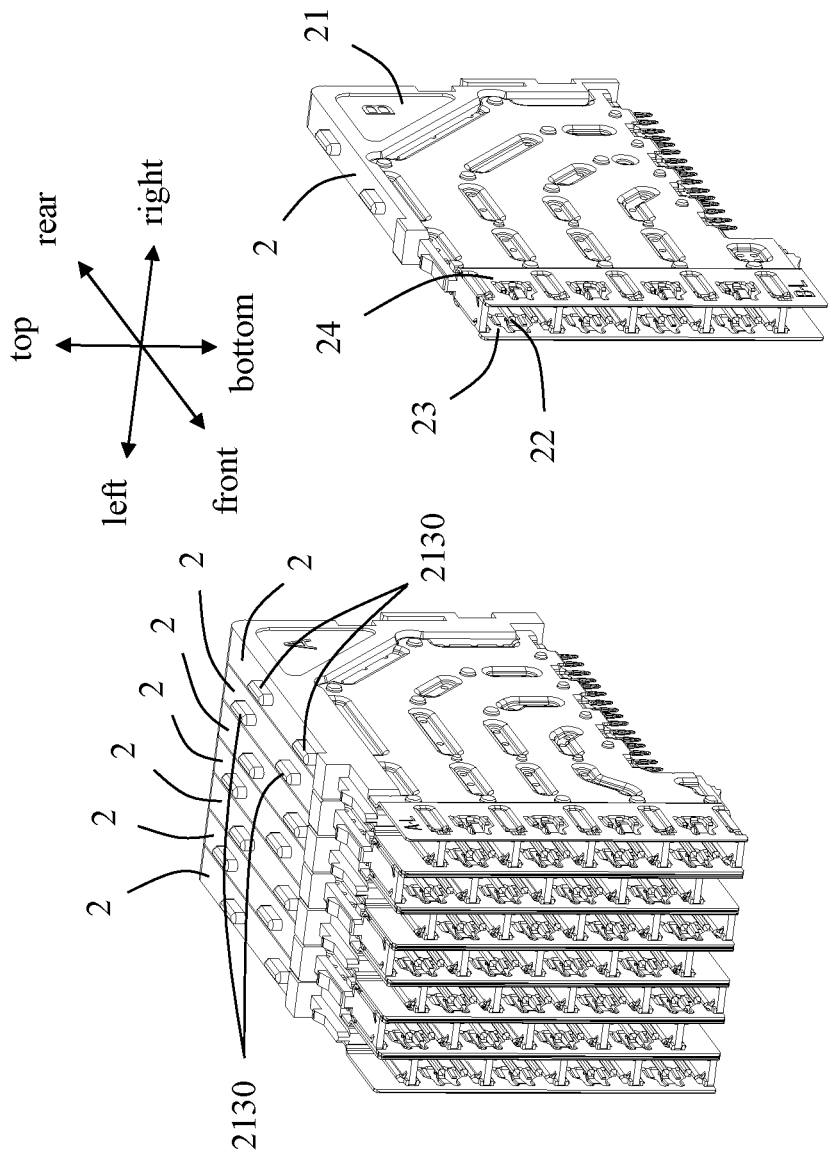
FIG. 9 is a partial perspective exploded view of the backplane connector of the present disclosure, in which one of the wafers is separated.
Figure 10:
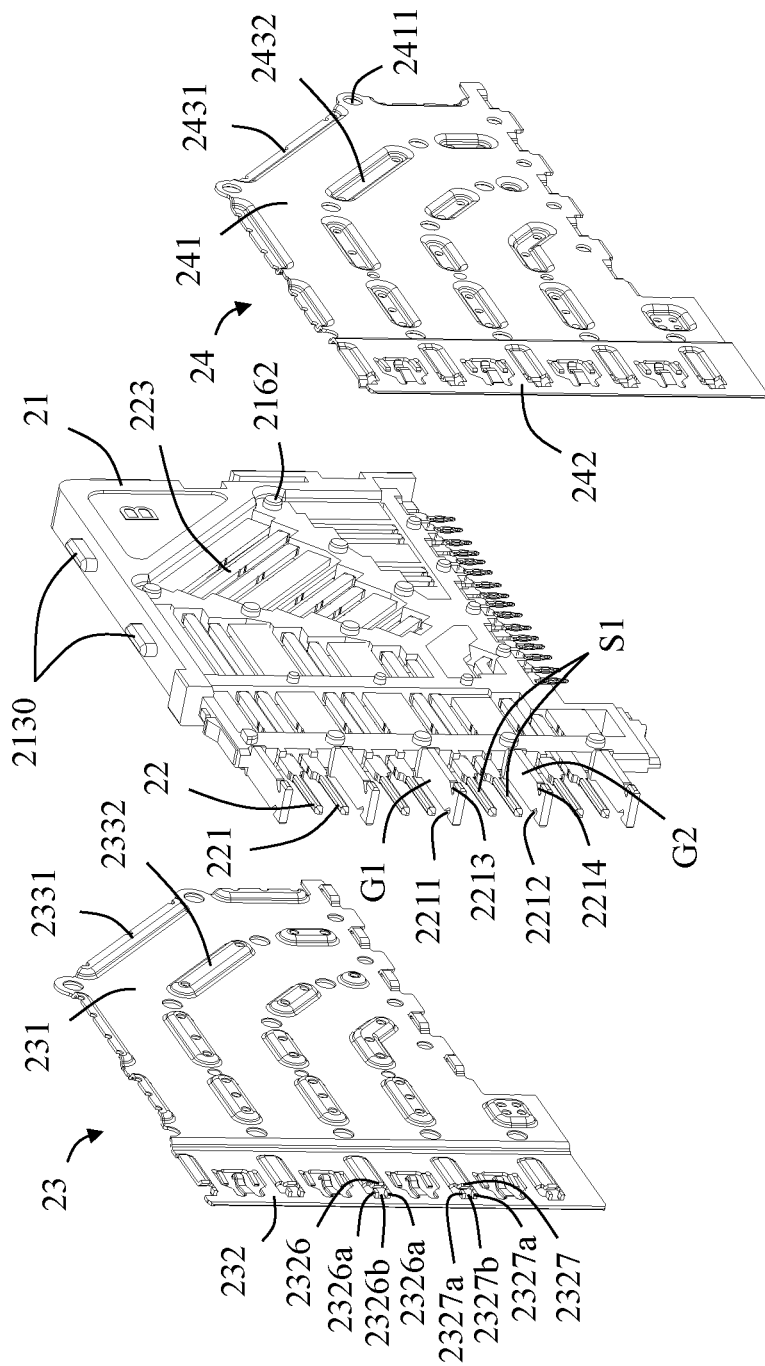
FIG. 10 is a partial perspective exploded view of the wafer in FIG. 9.
Figure 11:
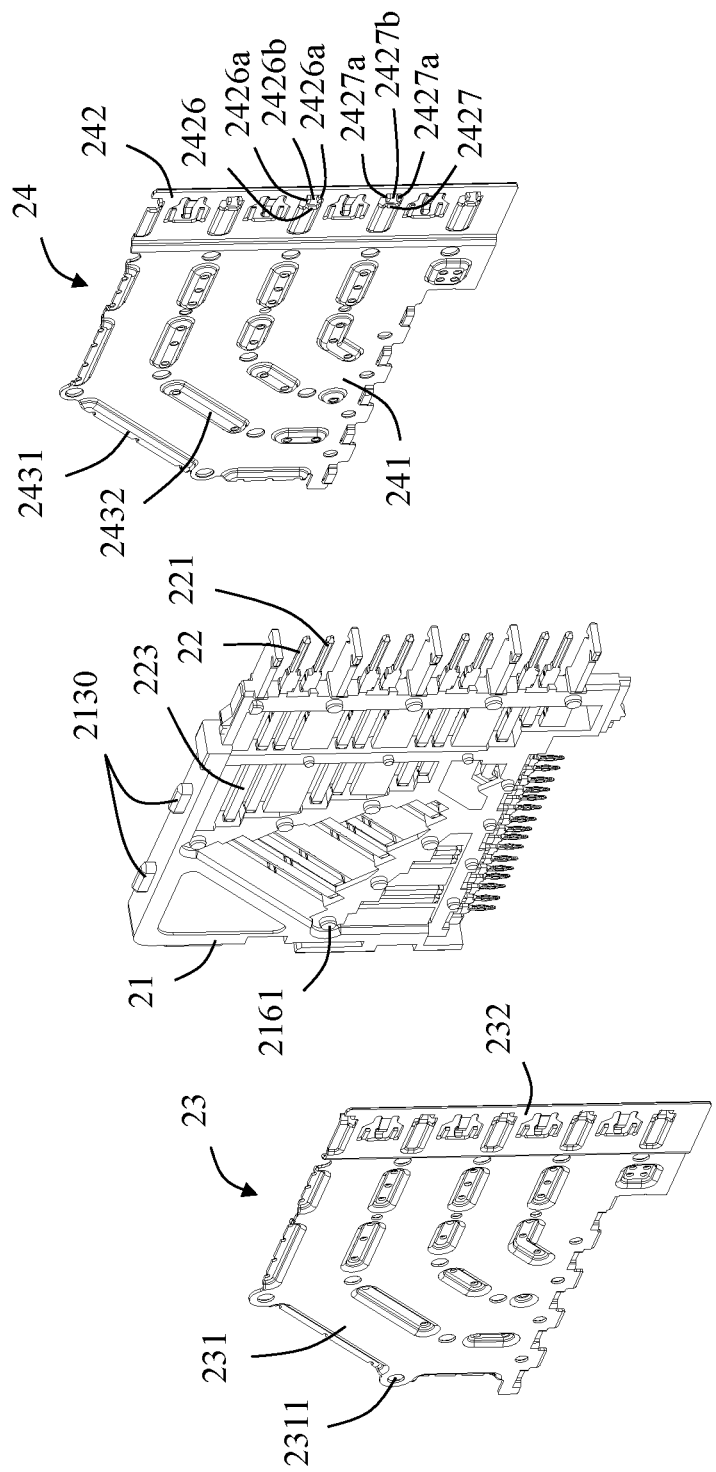
FIG. 11 is a partially exploded perspective view of FIG. 9 from another angle.

Referring to FIGS. 9 to 11, each wafer 2 includes an insulating frame 21, a plurality of conductive terminals 22 fixed to the insulating frame 21, and a metal shield located at least on one side of the insulating frame 21. In the illustrated embodiment of the present disclosure, the metal shield includes a first metal shield 23 fixed on one side of the insulating frame 21 and a second metal shield 24 fixed on the other side of the insulating frame 21.

Figure 12:
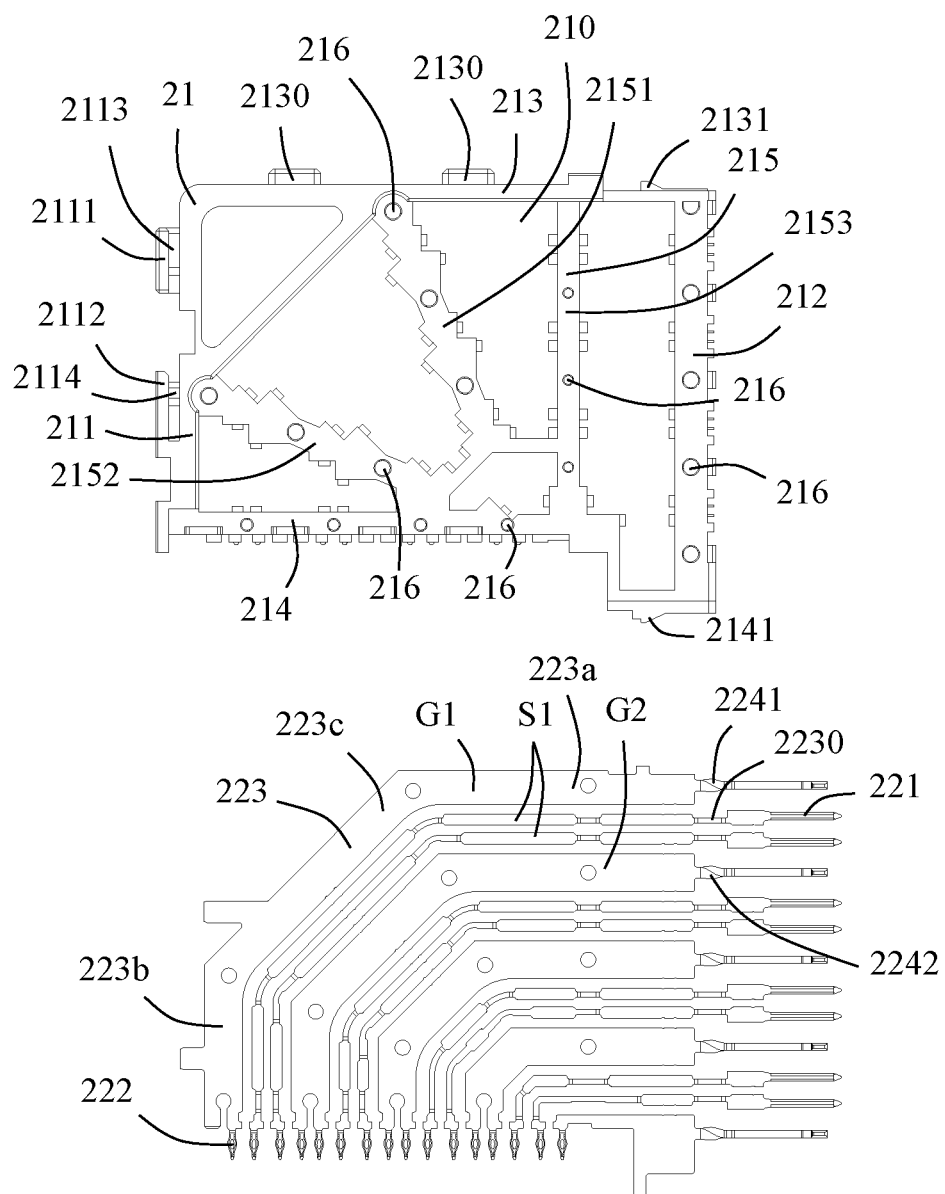
FIG. 12 is a side view of an insulating frame and conductive terminals separated from the insulating frame.

Referring to FIG. 12, the insulating frame 21 is roughly frame-shaped. The insulating frame 21 includes a rear wall 211, a front wall 212 opposite to the rear wall 211, a top wall 213 connecting one side of the rear wall 211 and one side of the front wall 212, a bottom wall 214 connecting the other side of the rear wall 211 and the other side of the front wall 212, and a plurality of connecting walls 215. The connecting wall 215 is capable of enhancing the structural strength of the frame. The rear walls 211 of the insulating frames 21 include a plurality of first protrusions 2111 protruding backwardly and spaced apart from each other in the left-right direction. The top walls 213 of the insulating frames 21 includes a plurality of second protrusions 2130 protruding upwardly and spaced apart from each other in the left-right direction. Referring to FIG. 9, in the illustrated embodiment of the present disclosure, each wafer 2 includes two second protrusions 2130 which are spaced apart from each other along the front-rear direction. The second protrusions 2130 of two adjacent wafers 2 are staggered in the front-rear direction. That is, the second protrusions 2130 at the corresponding positions of two adjacent wafers 2 are not in alignment with each other in the left-right direction. An extending direction (for example, the top-bottom direction) of the first protrusion 2111 is perpendicular to an extending direction (for example, the front-rear direction) of the second protrusion 2130.

Besides, the insulating frame 21 further includes a plurality of third protrusions 2112 disposed at intervals from the first protrusions 2111. The first protrusions 2111 and the corresponding third protrusions 2112 are in alignment with each other along the top-bottom direction. The first protrusion 2111 includes a first constriction portion 2113, and the third protrusion 2112 includes a second constriction portion 2114. In the illustrated embodiment of the present disclosure, the insulating frame 21 has a hollow portion 210. The connecting walls 215 include a first connecting wall 2151 connecting the top wall 213 and the bottom wall 214, and a second connecting wall 2152 connecting the rear wall 211 and the bottom wall 214. The first connecting wall 2151 and the second connecting wall 2152 are disposed obliquely. One ends of the first connecting wall 2151 and the second connecting wall 2152 are adjacent to each other, and the other ends are spread out so as to form a radial shape. The connecting walls 215 further include a first reinforcing wall 2153 connecting the top wall 213 and the bottom wall 214. The first reinforcing wall 2153 is parallel to the first front wall 212. Referring to FIG. 12, a width of the first reinforcing wall 2153 is smaller than a width of the first front wall 212. The first connecting wall 2151 and the second connecting wall 2152 are exposed in the hollow portion 210. The top wall 213 includes a first locking protrusion 2131 for being locked in the first locking groove 1311. The bottom wall 214 includes a second locking protrusion 2141 for being locked in the second locking groove 1321.

Referring to FIGS. 10 to 12, the insulating frame 21 further includes a plurality of posts 216 for fixing the first metal shield sheet 23 and the second metal shield sheet 24. In the illustrated embodiment of the present disclosure, the posts 216 are substantially cylindrical. In the illustrated embodiment of the present disclosure, the posts 216 are disposed on the bottom wall 214, the first connecting wall 2151, the second connecting wall 2152, the first reinforcing wall 2153 and the front wall 212. The first metal shield 23 and the second metal shield 24 are respectively located on opposite sides of the insulating frame 21. The posts 216 include a plurality of first posts 2161 and a plurality of second posts 2162. The first posts 2161 and the second posts 2162 are respectively disposed on opposite sides of the insulating frame 21 so as to be fixed and positioned with the first metal shield 23 and the second metal shield 24, respectively.

Referring to FIG. 12, each group of conductive terminals 22 includes a contact portion 221, a tail portion 222 and a connection portion 223 connecting the contact portion 221 and the tail portion 222. The contact portions 221 extend beyond the insulating frame 21. Some of the contact portions 221 are used to electrically connect with the mating connector. The tail portions 222 are used for being mounted to the circuit board 301. In the illustrated embodiment of the present disclosure, the contact portion 221 is substantially perpendicular to the tail portion 222. The connection portion 223 is curved. Specifically, the connection portion 223 includes a first section 223a parallel to the contact portion 221, a second section 223b parallel to the tail portion 222, and a third section 223c connecting the first section 223a and the second section 223b. Referring to FIG. 12, the first section 223a extends horizontally, the second section 223b extends vertically, and the third section 223c extends obliquely.

Each group of conductive terminals 22 include a plurality of first ground terminals G1, a plurality of second ground terminals G2, and a plurality of first signal terminals S1. In the illustrated embodiment of the present disclosure, two adjacent first signal terminals S1 form a pair of first differential signal terminals. Each pair of first differential signal terminals are located between one first ground terminal G1 and one second ground terminal G2. That is, each group of conductive terminals 22 are disposed in a manner of G1-S1-S1-G2, which is beneficial to improve the quality of signal transmission. The first differential signal terminals are narrow-side coupling or wide-side coupling. A width of the first ground terminal G1 and a width of the second ground terminal G2 are greater than a width of each first signal terminal S1 which is located between the first ground terminal G1 and the second ground terminal G2. Therefore, it is beneficial to increase the shielding area and improve the shielding effect.

In the illustrated embodiment of the present disclosure, the connection portions 223 of the conductive terminals 22 are insert-molded with the insulating frame 21. The connection portions 223 of the differential signal terminals, the connection portion 223 of the first ground terminal G1 and the connection portion 223 of the second ground terminal G2 are all exposed in the same hollow portion 210. Each connection portion 223 of the first signal terminals S1 includes a narrowed portion 2230 insert-molded with the insulating frame 21 so as to adjust the impedance of the first signal terminals S1 for achieving impedance matching. In the illustrated embodiment of the present disclosure, the contact portions 221 of the first signal terminals S1 are substantially needle-shaped. The contact portions 221 of the first ground terminal G1 and the second ground terminal G2 are substantially rectangular-shaped. The contact portions 221 of the first signal terminals S1 and the connection portions 223 of the conductive terminals 22 are coplanar, which means they are located in a first plane (for example, a horizontal plane). It should be noted that the technical term "coplanar" used in the present disclosure is intended to indicate that related components are substantially flush, which includes situations of incomplete coplanarity caused by manufacturing tolerances. However, in the illustrated embodiment of the present disclosure, the first ground terminal G1 includes a first torsion portion 2241 connected between its contact portion 221 and its first section 223a, so that the contact portion 221 of the first ground terminal G1 is located in a second plane (for example, a vertical plane) perpendicular to the first plane. The second ground terminal G2 includes a second torsion portion 2242 connected between its contact portion 221 and its first section 223a, so that the contact portion 221 of the second ground terminal G2 is also located in the second plane (for example, the vertical plane) perpendicular to the first plane. The contact portion 221 of the first ground terminal G1 and the contact portion 221 of the second ground terminal G2 are parallel to each other.

Figure 13:
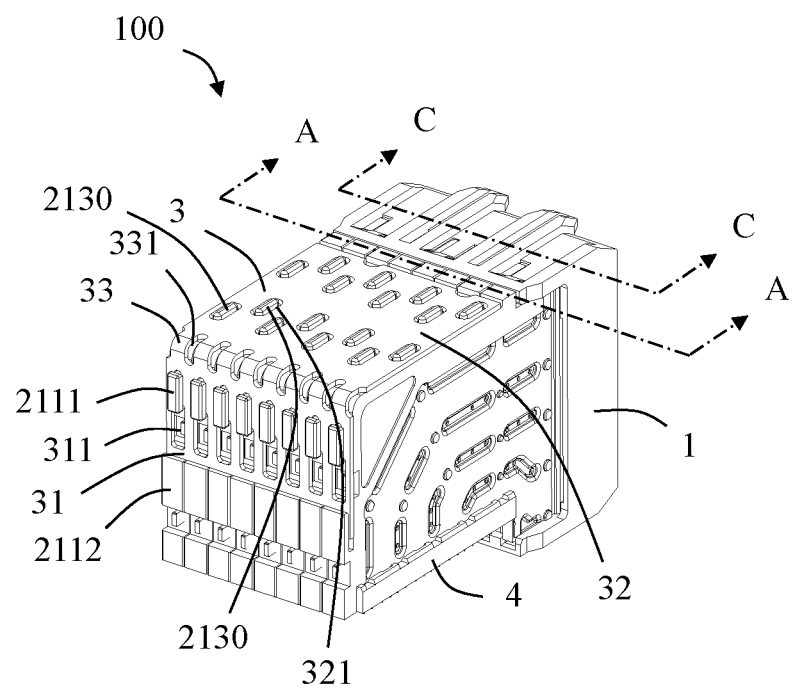
FIG. 13 is another perspective view of FIG. 1.
Figure 14:
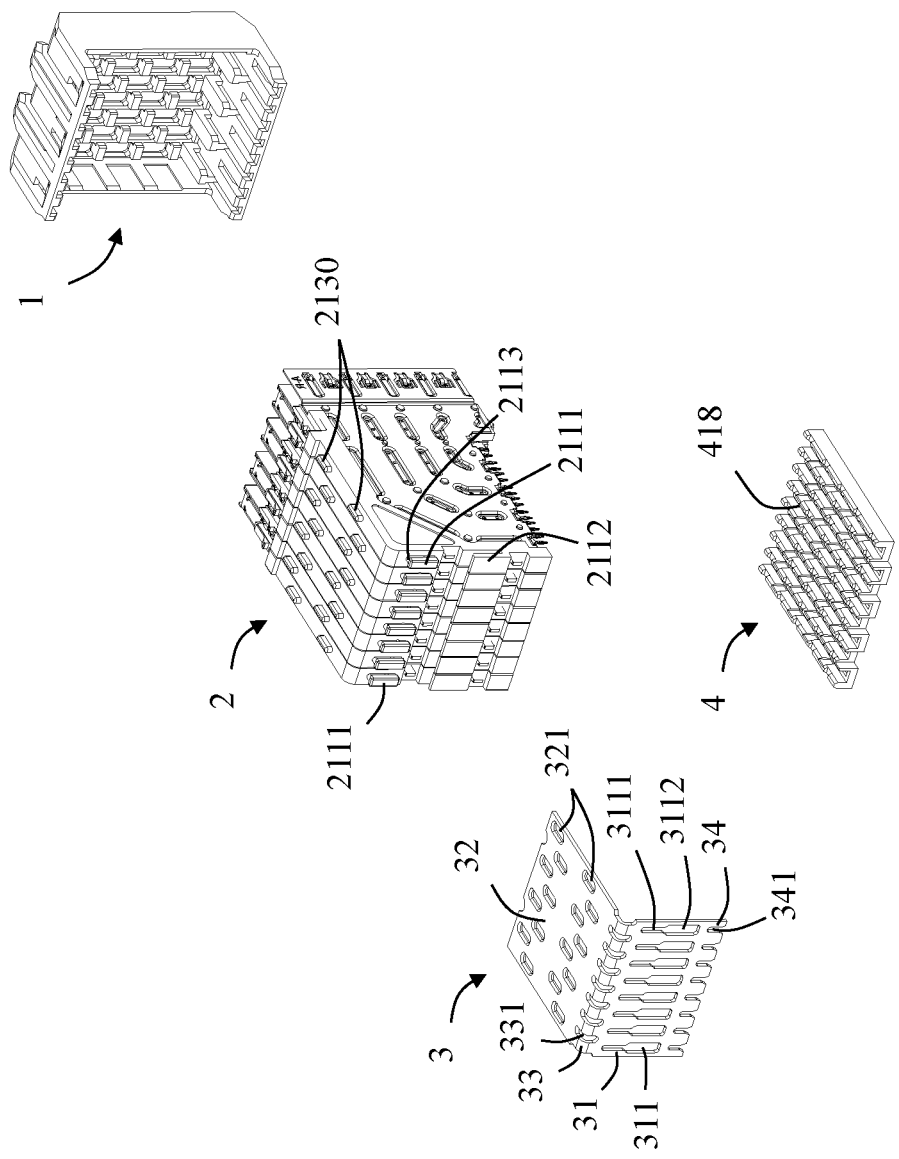
FIG. 14 is a partially exploded perspective view of FIG. 13.
Figure 15:
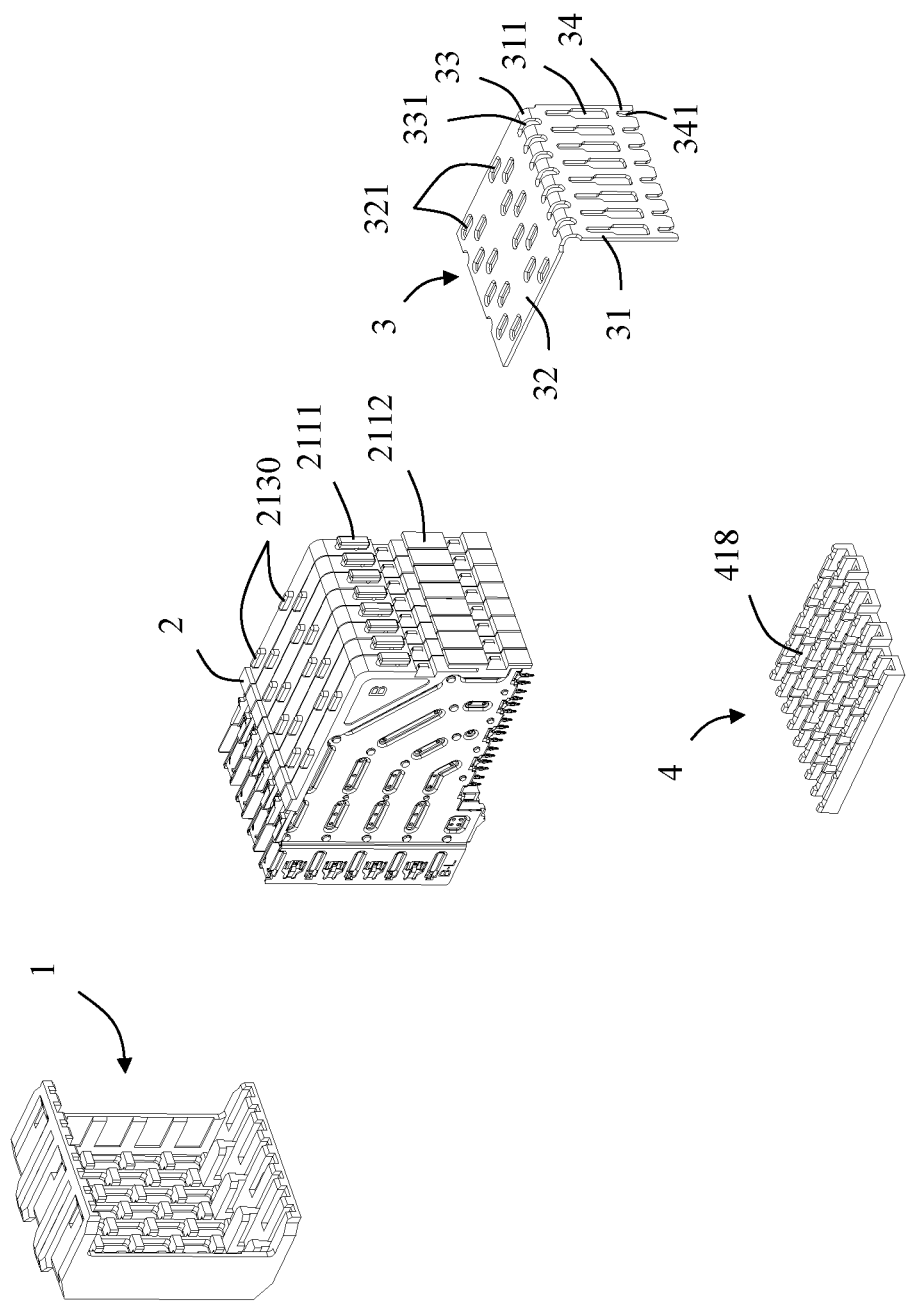
FIG. 15 is a partially exploded perspective view of FIG. 14 from another angle.

Referring to FIGS. 13 to 15, in the illustrated embodiment of the present disclosure, the spacer 3 is made of a metal material or an insulating material. The spacer 3 is used to assemble the plurality of wafers 2 together. The spacer 3 includes a first body portion 31, a second body portion 32, a bending portion 33 connecting the first body portion 31 and the second body portion 32, and a protruding piece 34 extending downwardly from the first body portion 31. The first body portion 31 is perpendicular to the second body portion 32. The first body portion 31 includes a plurality of first slots 311 for holding the first protrusions 2111. The second body portion 32 includes a plurality of second slots 321 for holding the second protrusions 2130. The protrusion piece 34 is provided with a plurality of slits 341 corresponding to the third protrusions 2112, so that the protrusion piece 34 is substantially comb-shaped. Each first slot 311 is a closed slot, which means a periphery of the first slot 311 is surrounded by the first body portion 31. Each slit 341 is a non-closed slit, which means one end (for example, a bottom end) of the slit 341 is opened. The slits 341 and the corresponding first slots 311 are spaced apart and aligned along the top-bottom direction. The first slot 311 includes a first slit 3111 and a second slit 3112 having a width larger than the first slit 3111. The first slit 3111 is located above the second slit 3112 and communicates with the second slit 3112. The slit 341 is located below the second slit 3112. The bending portion 33 includes with a plurality of openings 331 spaced apart along the left-right direction, so as to facilitate bending and control bending accuracy.

When assembling the spacer 3 to the plurality of wafers 2, firstly, the second slits 3112 of the spacer 3 correspond to the first protrusions 2111 along an extending direction of the contact portions 221, and the first protrusions 2111 pass through the second slits 3112. At this time, the second slots 321 are located above the second protrusions 2130. The second slots 321 and the second protrusions 2130 are in alignment with each other in a vertical direction. Then, the spacer 3 is moved downwardly along an extending direction of the tail portions 222, so that the first constriction portions 2113 are tightly clamped in the first slits 3111. At the same time, the second protrusions 2130 are positioned in the second slots 321. The second constriction portions 2114 of the third protrusions 2112 are tightly clamped in the slits 341 so as to achieve multiple fixation and improve reliability. With this arrangement, all the wafers 2 can be combined into a whole by the spacer 3 in order to prevent loosening. In addition, the wafers 2 can be prevented from being separated from the spacer 3 along the extending direction of the contact portions 221. At the same time, distances between the wafers 2 can be effectively controlled. Through the mating of the second protrusions 2130 and the second slots 321, the retaining piece 3 can be prevented from falling off by an external force in a horizontal direction, thereby the structural reliability of the backplane connector 100 is improved.

Referring to FIGS. 14 and 15, the mounting block 4 includes a plurality of through holes 418 for allowing the tail portions 222 of the conductive terminals 22 to pass through. Preferably, the mounting block 4 is made of electroplated plastic in order to further improve the shielding effect.

Figure 16:
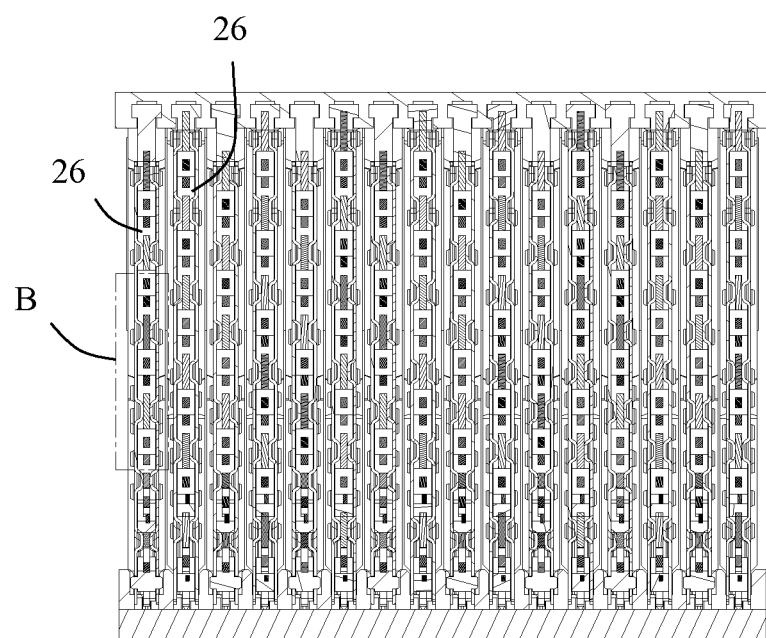
FIG. 16 is a schematic cross-sectional view taken along line A-A in FIG. 13.
Figure 19:
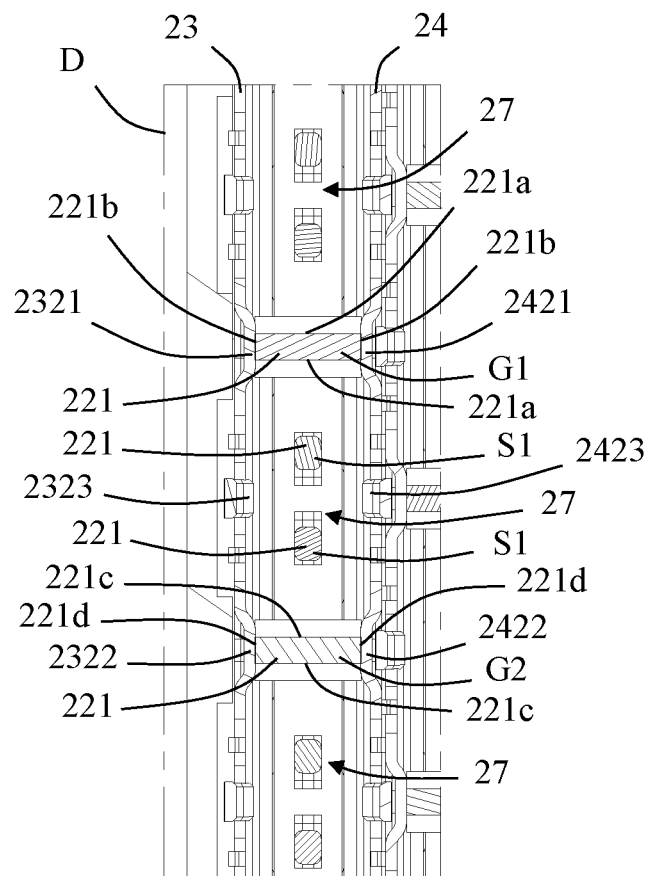
FIG. 19 is a partial enlarged view of a frame part D in FIG. 18.

Referring to FIGS. 16 and 19, in the illustrated embodiment of the present disclosure, the contact portion 221 and the connection portion 223 of the first ground terminal G1 have a first wide surface 221a and a first narrow surface 221b perpendicular to the first wide surface 221a. The contact portion 221 and the connection portion 223 of the second ground terminal G2 have a second wide surface 221c and a second narrow surface 221d perpendicular to the second wide surface 221c. The connection portions 223 of each pair of first differential signal terminals are located between the first narrow surface 221b of the first ground terminal G1 and the second narrow surface 221d of the second ground terminal G2 which are located on opposite sides of the connection portions 223 of each pair of first differential signal terminals. The contact portions 221 of each pair of first differential signal terminals are located between the first wide surface 221a of the first ground terminal G1 and the second wide surface 221c of the second ground terminal G2 which are located on opposite sides of the contact portions 221 of each pair of first differential signal terminals. In the illustrated embodiment of the present disclosure, a width of the first wide surface 221a and a width of the second wide surface 221c are greater than a width of each contact portion 221 of the first signal terminals S1, thereby better shielding can be provided for the contact portions 221 of the first signal terminals S1.

Figure 20:
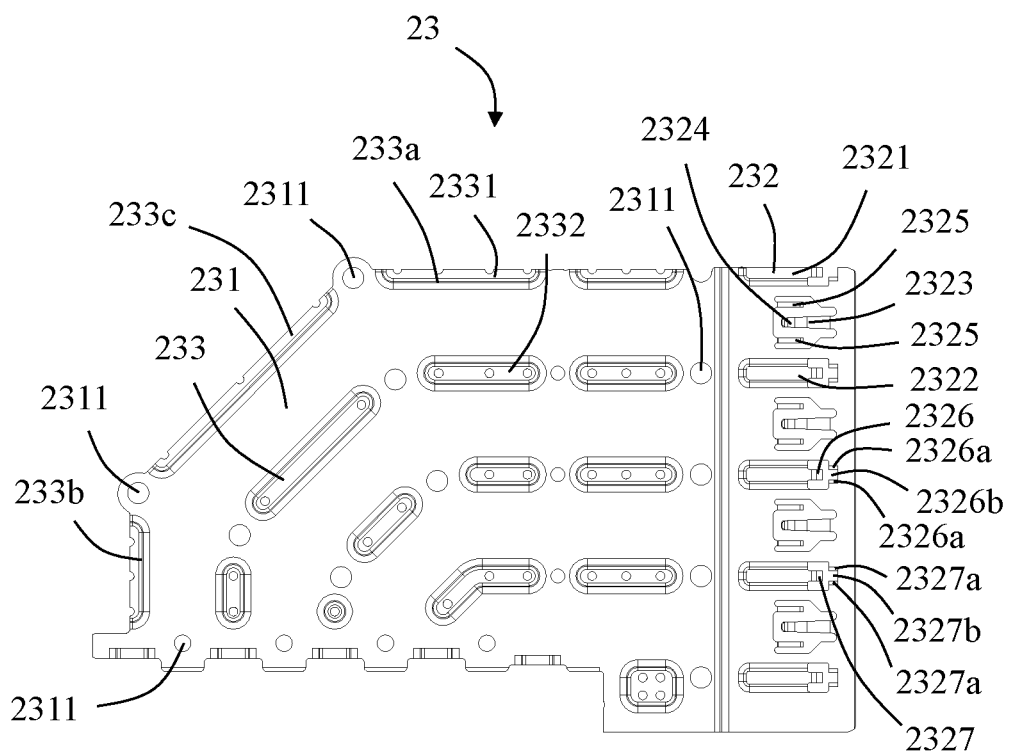
FIG. 20 is a side view of the first metal shield of the backplane connector.

In the illustrated embodiment of the present disclosure, the first metal shield 23 and the second metal shield 24 are symmetrically disposed on opposite sides of the first insulating frame 21. Referring to FIG. 20, the first metal shield 23 includes a first main body portion 231 and a first extension portion 232 extending from the first main body portion 231. The first main body portion 231 is located on one side of the connection portions 223 of the first conductive terminals 22. The first extension portion 232 is located on one side of the contact portions 221 of the first conductive terminals 22. In the illustrated embodiment of the present disclosure, the first extension portion 232 and the first main body portion 231 are located in different planes, in which the first extension portion 232 is farther away from the second metal shield 24 than the first main body portion 231. The first main body portion 231 includes a plurality of first mounting holes 2311 for mating with the plurality of first posts 2161. The first posts 2161 are fixed and positioned in the first mounting holes 2311 by soldering, thereby the fixing and positioning of the first metal shield 23 and the first insulating frame 21 are realized. The first main body 231 includes a plurality of ribs 233. The ribs 233 include a plurality of first ribs 2331 protruding toward the first ground terminals G1 and a plurality of second ribs 2332 protruding toward the second ground terminals G2. The first ribs 2331 corresponding to the first ground terminal G1 are disposed along an extending direction of the connection portion 223 of the first ground terminal G1. The second ribs 2332 corresponding to the second ground terminal G2 are disposed along an extending direction of the connection portion 223 of the second ground terminal G2. In the illustrated embodiment of the present disclosure, the first ribs 2331 and the second ribs 2332 are formed by stamping the first main body portion 231. The first ribs 2331 and the second ribs 2332 protrude toward the second metal shield 24. The first ribs 2331 and the second ribs 2332 are discontinuously disposed along the extending direction of the connection portion 223 of the first ground terminal G1 and the extending direction of the connection portion 223 of the second ground terminal G2, respectively, so as to achieve multi-position contact. In order to improve the reliability of the contact between the first metal shield 23 and the first ground terminals G1 and the second ground terminals G2, in the illustrated embodiment of the present disclosure, referring to FIG. 17, a wall thickness of the first rib 2331, a wall thickness of the second rib 2332, and a wall thickness of a portion of the first main body 231 located between the first rib 2331 and the second rib 2332 are the same. Specifically, each of the first ribs 2331 and the second ribs 2332 includes a first rib section 233a parallel to the contact portion 221, a second rib section 233b parallel to the tail portion 222, and a third rib section 233c connecting the first rib section 233a and the second rib section 233b. Referring to FIG. 20, the first rib section 233a extends horizontally, the second rib section 233b extends vertically, and the third rib section 233c extends obliquely. The first rib section 233a, the second rib section 233b and the third rib section 233c are in contact with the first section 223a, the second section 223b and the third section 223c of the first ground terminal G1 and the second ground terminal G2, respectively.

The first extension portion 232 includes a plurality of first bulges 2321 protruding toward the corresponding contact portions 221 of the first ground terminals G1, a plurality of second bulges 2322 protruding toward the corresponding contact portions 221 of the second ground terminals G2, and a plurality of first elastic pieces 2323 each of which is located between adjacent first bulge 2321 and second bulge 2322. The first elastic pieces 2323 extend along directions toward the first main body portion 231. Each first elastic piece 2323 has an arc-shaped contact portion 2324. In the illustrated embodiment of the present disclosure, the first extension portion 232 further includes two first protruding tabs 2325 located at opposite sides of each first elastic piece 2323. The first protruding tabs 2325 and the first elastic pieces 2323 extend along opposite directions. The first protruding tabs 2325 protrude sidewardly to contact the second metal shield 24 of the adjacent wafer 2 so as to improve the shielding effect. In the illustrated embodiment of the present disclosure, referring to FIG. 19, a wall thickness of the first bulge 2321, a wall thickness of the second bulge 2322 and a wall thickness of a portion of the first extension portion 232 located between the first bulge 2321 and the second bulge 2322 are the same.

Figure 21:
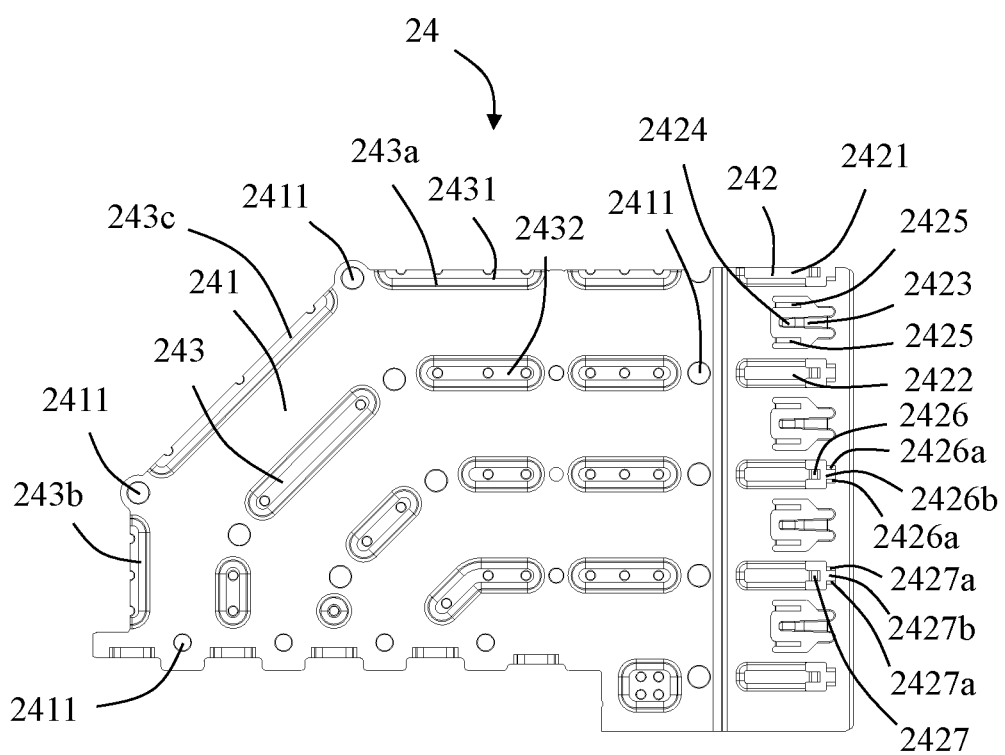
FIG. 21 is a side view of the second metal shield of the backplane connector.
Figure 22:
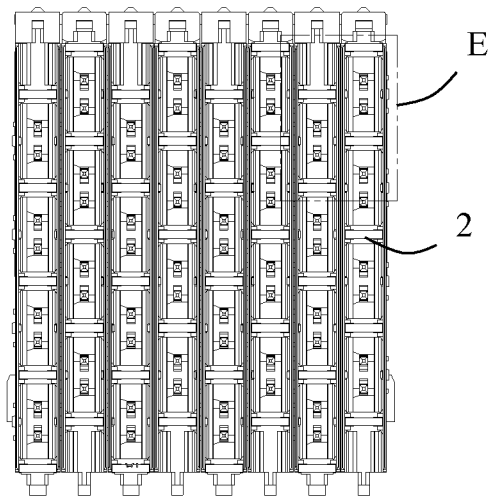
FIG. 22 is a front view of the wafer in FIG. 3.
Figure 23:
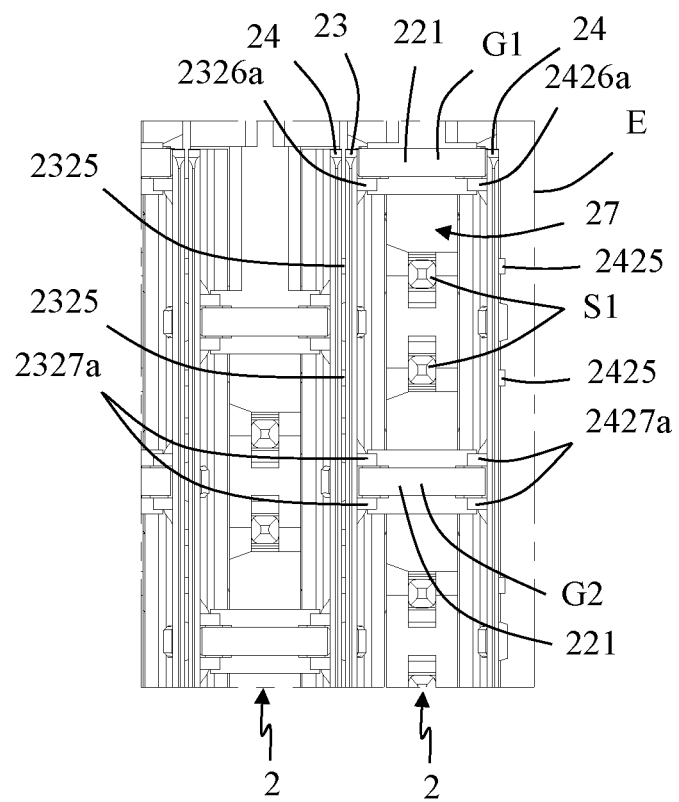
FIG. 23 is a partial enlarged view of a frame part E in FIG. 22.
Figure 24:
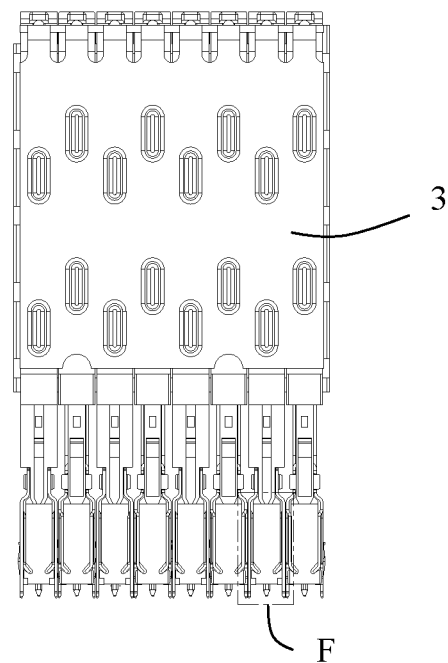
FIG. 24 is a top view of the wafer in FIG. 3.
Figure 25:
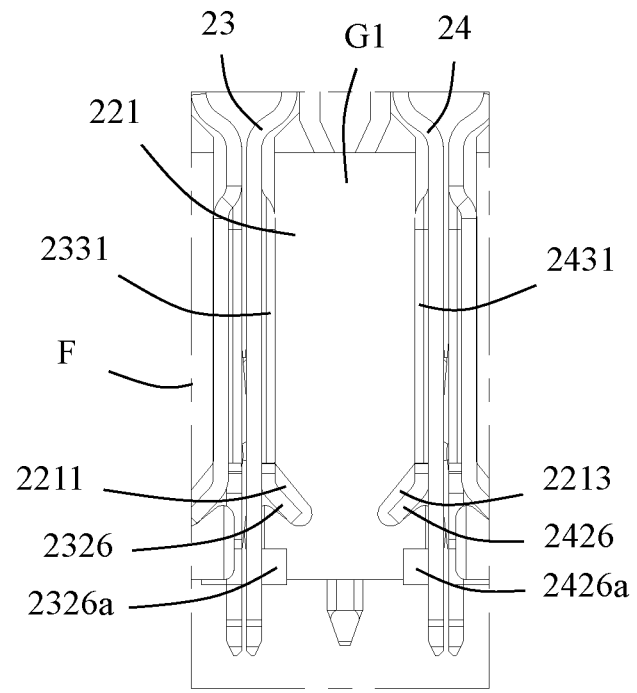
FIG. 25 is a partial enlarged view of a frame part F in FIG. 24.

Similarly, referring to FIG. 21, the second metal shield 24 includes a second main body portion 241 and a second extension portion 242 extending from the second main body portion 241. The second main body portion 241 is located on the other side of the connection portions 223 of the conductive terminals 22. The second extension portion 242 is located on the other side of the contact portions 221 of the conductive terminals 22. In the illustrated embodiment of the present disclosure, the second extension portion 242 and the second main body portion 241 are located in different planes, in which the second extension portion 242 is farther away from the first metal shield 23 than the second main body portion 241. The second main body portion 241 includes a plurality of second mounting holes 2411 for mating with the plurality of second posts 2162. The second posts 2162 are fixed and positioned in the second mounting holes 2411 by soldering, so as to realize the fixing and positioning of the second metal shield 24 and the first insulating frame 21. The second main body 241 includes a plurality of ribs 243. The ribs 243 include a plurality of third ribs 2431 protruding toward the first ground terminals G1 and a plurality of fourth ribs 2432 protruding toward the second ground terminals G2. The third ribs 2431 are disposed along the extending direction of the connection portion 223 of the first ground terminal G1. The fourth ribs 2432 are disposed along the extending direction of the connection portion 223 of the second ground terminal G2. In the illustrated embodiment of the present disclosure, the third ribs 2431 and the fourth ribs 2432 are formed by stamping the second main body portion 241. The third ribs 2431 and the fourth ribs 2432 protrude toward the first metal shield 23. The third ribs 2431 and the fourth ribs 2432 are discontinuously disposed along the extending direction of the connection portion 223 of the first ground terminal G1 and the extending direction of the connection portion 223 of the second ground terminal G2, respectively, so as to achieve multi-position contact. As a result, the reliability of the contact between the second metal shield 24 and the first ground terminals G1 and the second ground terminals G2 is improved. In the illustrated embodiment of the present disclosure, a wall thickness of the third rib 2431, a wall thickness of the fourth rib 2432 and a wall thickness of a portion of the second main body 241 located between the third rib 2431 and the fourth rib 2432 are the same. Specifically, each of the third rib 2431 and the fourth rib 2432 includes a first rib section 243a parallel to the contact portion 221, a second rib section 243b parallel to the tail portion 222, a third rib section 243c connecting the first rib section 243a and the second rib section 243b. Referring to FIG. 21, the first rib section 243a extends horizontally, the second rib section 243b extends vertically, and the third rib section 243c extends obliquely. The first rib section 243a, the second rib section 243b and the third rib section 243c are in contact with the first section 223a, the second section 223b and the third section 223c of the first ground terminal G1 and the second ground terminal G2, respectively. In an embodiment of the present disclosure, soldering is performed on the surfaces of the ribs 233 and the ribs 243 to solder the ribs 233 and the ribs 243 to the first ground terminals G1 and the second ground terminals G2. For example, soldering is performed on the surfaces of the first ribs 2331, the second ribs 2332, the third ribs 2431 and the fourth ribs 2432 in order to solder the first ribs 2331, the second ribs 2332, the third ribs 2431 and the fourth rib 2432 to the first ground terminals G1 and the second ground terminals G2. The soldering method is at least one of spot soldering, laser soldering and ultrasonic soldering. Preferably, the first rib 2331, the second rib 2332, the third rib 2431 and the fourth rib 2432 include through holes to expose the corresponding first ground terminal G1 and the corresponding second ground terminal G2, thereby facilitating soldering.

The second extension portion 242 includes a plurality of third bulges 2421 protruding toward the contact portions 221 of the first ground terminals G1, a plurality of fourth bulges 2422 protruding toward the contact portions 221 of the second ground terminals G2, and a plurality of second elastic pieces 2423 each of which is located between adjacent third bulge 2421 and fourth bulge 2422. The second elastic pieces 2423 extend along directions toward the second main body portion 241. Each second elastic piece 2423 has an arc-shaped contact portion 2424. In the illustrated embodiment of the present disclosure, the second extension portion 242 further includes two second protruding tabs 2425 located at opposite sides of each second elastic piece 2423. The second protruding tabs 2425 and the second elastic pieces 2423 extend along opposite directions. The second protruding tabs 2425 protrude sidewardly to contact the first metal shield 23 of the adjacent wafer 2 so as to improve the shielding effect. In the illustrated embodiment of the present disclosure, a wall thickness of the third bulge 2421, a wall thickness of the fourth bulge 2422, and a wall thickness of a portion of the second extension portion 242 located between the third bulge 2421 and the fourth bulge 2422 are the same.

The contact protrusions 124 are disposed opposite to the first ground terminal G1 and the second ground terminal G2. The first extension portions 232 are electrically connected to a side surface of the corresponding contact protrusions 124. The second extension portion 242 are electrically connected to the other side surface of the corresponding contact protrusions 124. As a result, the first metal shield 23 and the second metal shield 24 in the single wafer 2 can be electrically connected at the mating surface 121. That is, the first metal shield sheet 23 and the second metal shield sheet 24 are electrically connected to each other through the contact protrusions 124. Besides, the length of a shielding cavity 26 surrounded by the first ground terminal G1, the second ground terminal G2, the first metal shield sheet 23 and the second metal shield sheet 24 is increased, thereby further improving the shielding effect.

Figure 17:
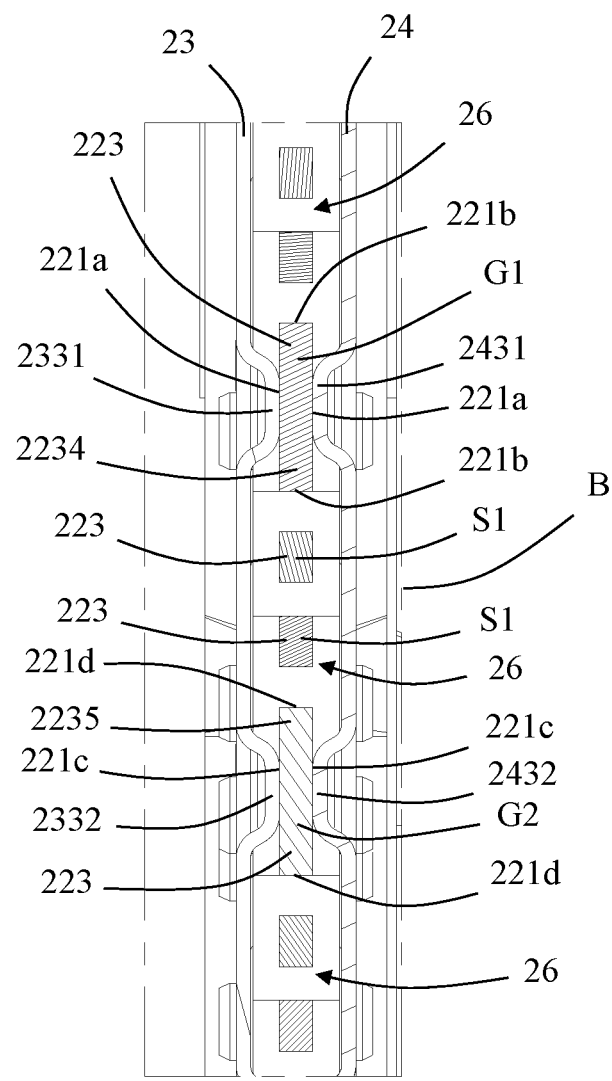
FIG. 17 is a partial enlarged view of a frame part B in FIG. 16.

Referring to FIG. 17, along a length of the connection portion 223 of the conductive terminal 22, the first rib 2331 of the first metal shield 23 and the third rib 2431 of the second metal shield 24 respectively contact two opposite sides of the connection portion 223 of the first ground terminal G1, and the second rib 2332 of the first metal shield 23 and the fourth rib 2432 of the second metal shield 24 respectively contact two opposite sides of the connection portion 223 of the second ground terminal G2, thereby forming the shielding cavity 26 surrounding the outer periphery of the connection portions 223 of each pair of first differential signal terminals. In the illustrated embodiment of the present disclosure, the first rib 2331 and the third rib 2431 respectively contact the first wide surface 221*a* of the connection portion 223 of the first ground terminal G1. The second rib 2332 and the fourth rib 2432 respectively contact the second wide surface 221*c* of the connection portion 223 of the second ground terminal G2. In the illustrated embodiment of the present disclosure, the shielding cavity 26 is jointly formed by the first main body portion 231, the second main body portion 241, the first ground terminal G1 and the second ground terminal G2. The connection portion 223 of the first ground terminal G1 includes a first tab portion 2234 protruding into the shielding cavity 26. The connection portion 223 of the second ground terminal G2 includes a second tab portion 2235 protruding into the shielding cavity 26. The connection portions 223 of the first differential signal terminals are located between the first tab portion 2234 and the second tab portion 2235. In the illustrated embodiment of the present disclosure, there are a plurality of the shielding cavities 26 which are disposed along an arrangement direction of each group of the conductive terminals 22. Two adjacent shielding cavities 26 share a single first ground terminal G1 or a single second ground terminal G2. In addition, a part of the shared first ground terminal G1 protrudes into one shielding cavity 26, and another part of the shared first ground terminal G1 protrudes into another shielding cavity 26.

Referring to FIG. 19, in the length of the contact portion 221 of the conductive terminal 22, the first bulge 2321 of the first metal shield 23 and the third bulge 2421 of the second metal shield 24 respectively contact two opposite side surfaces of the contact portion 221 of the first ground terminal G1, and the second bulge 2322 of the first metal shield 23 and the fourth bulge 2422 of the second metal shield 24 respectively contact two opposite side surfaces of the contact portion 221 of the second ground terminal G2. In the illustrated embodiment of the present disclosure, the first bulge 2321 of the first metal shield 23 and the third bulge 2421 of the second metal shield 24 respectively contact the first narrow surfaces 221*b* of the contact portion 221 of the first ground terminal G1. The second bulge 2322 of the first metal shield 23 and the fourth bulge 2422 of the second metal shield 24 respectively contact the second narrow surfaces 221*d* of the contact portion 221 of the second ground terminal G2. The first extension portion 232, the second extension portion 242, the first ground terminal G1 and the second ground terminal G2 jointly form a shielding space 27 for accommodating the corresponding contact portions 221 of the first differential signal terminals. The first elastic piece 2323 and the second elastic piece 2423 extend into the shielding space 27. In the illustrated embodiment of the present disclosure, there are multiple shielding spaces 27 which are disposed along a stacking direction of each group of the conductive terminals 22. Two adjacent shielding spaces 27 share a single first ground terminal G1 or a single second ground terminal G2. One first wide surface 221*a* of the contact portion 221 of the shared first ground terminal G1 is exposed to the shielding space 27, and the other first wide surface 221*a* of the contact portion 221 of the shared first ground terminal G1 is exposed to an adjacent shielding space 27. Similarly, a first wide surface 221*c* of the contact portion 221 of the shared second ground terminal G2 is exposed to the adjacent shielding space 27, and the other wide surface 221*c* of the contact portion 221 of the shared second ground terminal G2 is exposed to another adjacent shielding space 27. The first protruding tabs 2325 and the second protruding tabs 2425 are inclined in a direction away from the shielding space 27 to facilitate contact with the adjacent wafers 2.

Figure 18:
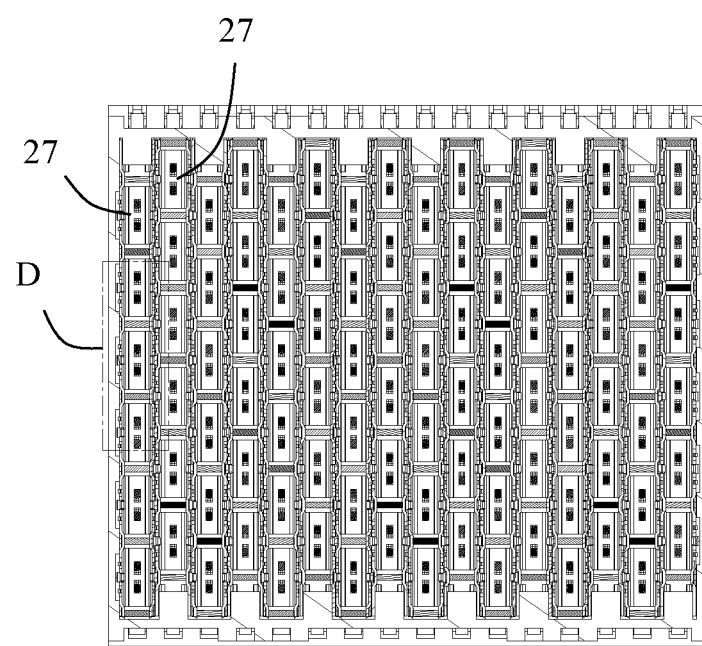
FIG. 18 is a schematic cross-sectional view taken along line C-C in FIG. 13.

In the illustrated embodiment of the present disclosure, there are multiple first wafers 2 of the backplane connector 100, and the terminal arrangement of two adjacent wafers 2 are staggered. Correspondingly, the shielding cavities 26 at the same position of two adjacent wafers 2 are staggered (referring to FIG. 16), and the shielding spaces 27 at the same position of two adjacent wafers 2 are staggered (referring to FIG. 18).

The first extension portion 232 and/or the second extension portion 242 include limiting structures which restrict the contact portions 221 of the first ground terminal G1 and/or the contact portions 221 of the second ground terminal G2 in the front-rear direction and/or the top-bottom direction.

Specifically, as shown in FIGS. 10, 11, and 22 to 25, the contact portion 221 of the first ground terminal G1 includes a first limiting slot 2211 and a third limiting slot 2213 opposite to the first limiting slot 2211. The first limiting slot 2211 and the third limiting slot 2213 are symmetrically disposed on opposite sides of the contact portion 221 of the first ground terminal G1. The first limiting slot 2211 and the third limiting slot 2213 extend through the first narrow surfaces 221*b* of the first ground terminal G1, respectively. In the illustrated embodiment of the present disclosure, an angle between the first limiting slot 2211 and the front-rear direction, and an angle between the third limiting slot 2213 and the front-rear direction are approximately 45 degrees. Similarly, the contact portion 221 of the second ground terminal G2 includes a second limiting slot 2212 and a fourth limiting slot 2214 opposite to the second limiting slot 2212. The second limiting slot 2212 and the fourth limiting slot 2214 are symmetrically disposed on opposite sides of the contact portion 221 of the second ground terminal G2. The second limiting slot 2212 and the fourth limiting slot 2214 extend through the second narrow surfaces 221*d* of the second ground terminal G2, respectively. In the illustrated embodiment of the present disclosure, an angle between the second limiting slot 2212 and the front-rear direction, and an angle between the fourth limiting slot 2214 and the front-rear direction are approximately 45 degrees.

The first extension portion 232 includes a first limiting protrusion 2326 locked in the first limiting slot 2211 and a second limiting protrusion 2327 locked in the second limiting slot 2212. Each of the first limiting protrusion 2326 and the second limiting protrusion 2327 forms an angle of 45 degrees with respect to a vertical plane. Similarly, the second extension portion 242 includes a third limiting protrusion 2426 locked in the third limiting slot 2213 and a fourth limiting protrusion 2427 locked in the fourth limiting slot 2214. Each of the third limiting protrusion 2426 and the fourth limiting protrusion 2427 forms an angle of 45 degrees with respect to the vertical plane. The first limiting protrusion 2326 and the third limiting protrusion 2426 are symmetrically disposed on opposite sides of the contact portion 221 of the first ground terminal G1. The first limiting protrusion 2326 and the third limiting protrusion 2426 are adapted to restrict the contact portion 221 of the first ground terminal G1 in the front-rear direction to prevent it from moving backwardly. The second limiting protrusion 2327 and the fourth limiting protrusion 2427 are symmetrically disposed on opposite sides of the contact portion 221 of the second ground terminal G2. The second limiting protrusion 2327 and the fourth limiting protrusion 2427 are adapted to restrict the contact portion 221 of the second ground terminal G2 in the front-rear direction.

In the illustrated embodiment of the present disclosure, the first limiting protrusion 2326 is located at a front free end of the first bulge 2321 and is integrally stamped from the first bulge 2321. The second limiting protrusion 2327 is located at a front free end of the second bulge 2322 and is integrally stamped from the second bulge 2322. The third limiting protrusion 2426 is located at a front free end of the third bulge 2421 and is integrally stamped from the third bulge 2421. The fourth limiting protrusion 2427 is located at a front free end of the fourth bulge 2422 and is integrally stamped from the fourth bulge 2422.

In addition, the first extension portion 232 further includes two first clamping blocks 2326a and two second clamping blocks 2327a. The two first clamping blocks 2326a include a first clamping groove 2326b for restricting the contact portion 221 of the first ground terminal G1 in the vertical direction. The two second clamping blocks 2327a include a second clamping groove 2327b for restricting the contact portion 221 of the second ground terminal G2 in the vertical direction. Similarly, the second extension portion 242 further includes two third clamping blocks 2426a and two fourth clamping blocks 2427a. The two third clamping blocks 2426a include a third clamping groove 2426b for restricting the contact portion 221 of the first ground terminal G1 in the vertical direction. The two fourth clamping blocks 2427a include a fourth clamping groove 2427b for restricting the contact portion 221 of the second ground terminal G2 in the vertical direction.

Of course, in other embodiments, the first clamping block 2326a, the second clamping block 2327a, the third clamping block 2426a and the fourth clamping block 2427a can also be provided as one which is used to abut against the corresponding contact portions 221 of the first ground terminal G1 and the second ground terminal G2 in the vertical direction so as to achieve position restriction. In the illustrated embodiment of the present disclosure, the first clamping block 2326a is located at a front end of the first limiting protrusion 2326. The second clamping block 2327a is located at a front end of the second limiting protrusion 2327. The third clamping block 2426a is located at a front end of the third limiting protrusion 2426. The fourth clamping block 2427a is located at a front end of the fourth limiting protrusion 2427.

The above embodiments are only used to illustrate the present disclosure and not to limit the technical solutions described in the present disclosure. The understanding of this specification should be based on those skilled in the art. Descriptions of directions, such as "front", "back", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector, comprising a plurality of wafers and a spacer to combine the plurality of wafers;
   wherein each wafer comprises an insulating frame and a plurality of conductive terminals fixed to the insulating frame, the insulating frame comprises a first protrusion at a rear end of the insulating frame and a second protrusion at a top side of the insulating frame; and
   wherein the spacer comprises a first body portion and a second body portion, the first body portion comprises a first slot for locking with the first protrusion, and the second body portion comprises a second slot for locking with the second protrusion.

2. The backplane connector according to claim 1, wherein the first protrusion comprises a first constriction portion, the first slot comprises a first slit and a second slit with a width larger than the first slit, the first slit is in communication with the second slit, the second slit is adapted to allow the first protrusion to extend through, and the first constriction portion is clamped in the first slit.

3. The backplane connector according to claim 1, wherein an extending direction of the first protrusion is perpendicular to an extending direction of the second protrusion, and the first body portion is perpendicular to the second body portion.

4. The backplane connector according to claim 1, wherein each wafer comprises two second protrusions which are spaced apart from each other, the second protrusions of two adjacent wafers are disposed in a staggered manner in a front-rear direction.

5. The backplane connector according to claim 1, wherein the spacer is made of metal material and comprises a bending portion connecting the first body portion and the second body portion, and the bending portion comprises a plurality of openings which are spaced apart from each other along a left-right direction.

6. The backplane connector according to claim 2, wherein each insulating frame further comprises a third protrusion spaced apart from the first protrusion, each third protrusion comprises a second constriction portion, the spacer comprises a protruding piece extending from the first body portion, the protruding piece comprises a plurality of slits each of which is adapted to clamp the second constriction portion.

7. The backplane connector according to claim 6, wherein the first protrusion and the third protrusion are in alignment with each other in a top-bottom direction, and the slit and the first slot are spaced apart and are in alignment with each other in the top-bottom direction.

8. The backplane connector according to claim 1, wherein the conductive terminals comprise differential signal terminals, a first ground terminal and a second ground terminal, wherein the differential signal terminals are located between the first ground terminal and the second ground terminal;
   wherein the backplane connector further comprises a housing, the housing comprises a mating surface and a plurality of terminal receiving grooves extending through the mating surface, the terminal receiving grooves are disposed in multiple rows along a top-bottom direction, two adjacent rows of terminal receiving grooves are disposed in a staggered manner in the top-bottom direction, and the contact portions of each group of differential signal terminals are exposed in corresponding terminal receiving grooves.

9. The backplane connector according to claim 8, wherein each wafer comprises a first metal shield and a second metal shield which are located on opposite sides of the insulating frame, respectively; the first metal shield comprises a first extension portion disposed on one side of the contact portions of the conductive terminals, and the second metal shield comprises a second extension portion disposed on the other side of the contact portions of the conductive terminals.

10. The backplane connector according to claim 9, wherein the first extension portion comprises a first bulge protruding toward the first ground terminal and a second bulge protruding toward the second ground terminal;
   wherein the second extension portion comprises a third bulge protruding toward the first ground terminal and a fourth bulge protruding toward the second ground terminal; and
   wherein the first bulge and the third bulge are in contact with opposite side surfaces of the contact portion of the first ground terminal, respectively; the second bulge and the fourth bulge are in contact with opposite side surfaces of the contact portion of the second ground terminal, respectively; and the first extension portion, the second extension portion, the first ground terminal and the second ground terminal jointly form a shielding space enclosing the contact portions of the differential signal terminals.

* * * * *